(12) United States Patent
Tsai et al.

(10) Patent No.: US 12,057,432 B2
(45) Date of Patent: *Aug. 6, 2024

(54) INTEGRATED FAN-OUT PACKAGE STRUCTURES WITH RECESSES IN MOLDING COMPOUND

(71) Applicant: Taiwan Semiconductor Manufacturing Co., Ltd., Hsinchu (TW)

(72) Inventors: Po-Hao Tsai, Zhongli (TW); Li-Hui Cheng, New Taipei (TW); Jui-Pin Hung, Hsinchu (TW); Jing-Cheng Lin, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 654 days.

This patent is subject to a terminal disclaimer.

(21) Appl. No.: 16/933,593

(22) Filed: Jul. 20, 2020

(65) Prior Publication Data

US 2020/0350279 A1 Nov. 5, 2020

Related U.S. Application Data

(60) Continuation of application No. 16/101,902, filed on Aug. 13, 2018, now Pat. No. 10,720,403, which is a
(Continued)

(51) Int. Cl.
*H01L 23/00* (2006.01)
*H01L 21/3105* (2006.01)
(Continued)

(52) U.S. Cl.
CPC ........ *H01L 24/96* (2013.01); *H01L 21/31053* (2013.01); *H01L 21/311* (2013.01);
(Continued)

(58) Field of Classification Search
CPC ............. H01L 21/31053; H01L 21/311; H01L 21/561; H01L 21/565; H01L 21/568;
(Continued)

(56) References Cited

U.S. PATENT DOCUMENTS

| 6,831,352 B1 | 12/2004 | Tsai |
| 7,868,432 B2 | 1/2011 | Lee et al. |

(Continued)

FOREIGN PATENT DOCUMENTS

| CN | 101443979 A | 5/2009 |
| CN | 101689590 A | 3/2010 |
| JP | 2013062470 A | 4/2013 |

*Primary Examiner* — Nicholas J Tobergte
*Assistant Examiner* — Kevin Quinto
(74) *Attorney, Agent, or Firm* — Slater Matsil, LLP

(57) ABSTRACT

A package includes a first die and a second die. The first die includes a first substrate and a first metal pad overlying the first substrate. The second die includes a second substrate and a second metal pad overlying the second substrate. A molding compound molds the first die and the second die therein. The molding compound has a first portion between the first die and the second die, and a second portion, which may form a ring encircles the first portion. The first portion and the second portion are on opposite sides of the first die. The first portion has a first top surface. The second portion has a second top surface higher than the first top surface.

20 Claims, 9 Drawing Sheets

Related U.S. Application Data continuation of application No. 15/297,670, filed on Oct. 19, 2016, now Pat. No. 9,953,955, which is a continuation of application No. 14/858,530, filed on Sep. 18, 2015, now Pat. No. 10,062,662, which is a division of application No. 14/026,742, filed on Sep. 13, 2013, now Pat. No. 9,142,432.

(51) Int. Cl.

| | | |
|---|---|---|
| *H01L 21/311* | (2006.01) | |
| *H01L 21/56* | (2006.01) | |
| *H01L 21/683* | (2006.01) | |
| *H01L 21/78* | (2006.01) | |
| *H01L 23/31* | (2006.01) | |
| *H01L 23/538* | (2006.01) | |

(52) U.S. Cl.
CPC .......... *H01L 21/561* (2013.01); *H01L 21/565* (2013.01); *H01L 21/568* (2013.01); *H01L 21/6835* (2013.01); *H01L 21/6836* (2013.01); *H01L 21/78* (2013.01); *H01L 23/3114* (2013.01); *H01L 23/5389* (2013.01); *H01L 24/02* (2013.01); *H01L 24/03* (2013.01); *H01L 24/05* (2013.01); *H01L 24/11* (2013.01); *H01L 24/13* (2013.01); *H01L 24/19* (2013.01); *H01L 2221/68327* (2013.01); *H01L 2221/6834* (2013.01); *H01L 2221/68359* (2013.01); *H01L 2221/68372* (2013.01); *H01L 2224/02205* (2013.01); *H01L 2224/0231* (2013.01); *H01L 2224/02379* (2013.01); *H01L 2224/0239* (2013.01); *H01L 2224/024* (2013.01); *H01L 2224/0401* (2013.01); *H01L 2224/04105* (2013.01); *H01L 2224/05008* (2013.01); *H01L 2224/05025* (2013.01); *H01L 2224/05124* (2013.01); *H01L 2224/11334* (2013.01); *H01L 2224/1146* (2013.01); *H01L 2224/11849* (2013.01); *H01L 2224/12105* (2013.01); *H01L 2224/13026* (2013.01); *H01L 2924/01013* (2013.01); *H01L 2924/01028* (2013.01); *H01L 2924/01029* (2013.01); *H01L 2924/01074* (2013.01); *H01L 2924/04642* (2013.01); *H01L 2924/05042* (2013.01); *H01L 2924/05442* (2013.01); *H01L 2924/0549* (2013.01); *H01L 2924/07025* (2013.01); *H01L 2924/10253* (2013.01); *H01L 2924/1027* (2013.01); *H01L 2924/1032* (2013.01); *H01L 2924/12042* (2013.01); *H01L 2924/1432* (2013.01); *H01L 2924/1433* (2013.01); *H01L 2924/1434* (2013.01); *H01L 2924/181* (2013.01); *H01L 2924/1815* (2013.01); *H01L 2924/18162* (2013.01); *H01L 2924/3512* (2013.01)

(58) Field of Classification Search
CPC . H01L 21/6835; H01L 21/6836; H01L 21/78; H01L 2221/68327; H01L 2221/6834; H01L 2221/68359; H01L 2221/68372; H01L 2224/02205; H01L 2224/0231; H01L 2224/02379; H01L 2224/0239; H01L 2224/024; H01L 2224/0401; H01L 2224/04105; H01L 2224/05008; H01L 2224/05025; H01L 2224/05124; H01L 2224/11334; H01L 2224/1146; H01L 2224/11849; H01L 2224/12105; H01L 2224/13026; H01L 23/3114; H01L 23/5389; H01L 24/02; H01L 24/03; H01L 24/05; H01L 24/11; H01L 24/13; H01L 24/19; H01L 24/96; H01L 2924/01013; H01L 2924/01028; H01L 2924/01029; H01L 2924/01074; H01L 2924/04642; H01L 2924/05042; H01L 2924/05442; H01L 2924/0549; H01L 2924/07025; H01L 2924/10253; H01L 2924/1027; H01L 2924/1032; H01L 2924/12042; H01L 2924/1432; H01L 2924/1433; H01L 2924/1434; H01L 2924/181; H01L 2924/1815; H01L 2924/18162; H01L 2924/3512

See application file for complete search history.

(56) References Cited

U.S. PATENT DOCUMENTS

| | | | |
|---|---|---|---|
| 7,964,888 B2 | 6/2011 | Loh et al. | |
| 8,105,875 B1 | 1/2012 | Hu et al. | |
| 8,778,733 B2 | 7/2014 | Fuergut et al. | |
| 9,142,432 B2 | 9/2015 | Tsai et al. | |
| 10,062,662 B2 * | 8/2018 | Tsai | H01L 24/02 |
| 2012/0028411 A1 * | 2/2012 | Yu | H01L 21/561 |
| | | | 438/118 |
| 2013/0062760 A1 | 3/2013 | Hung et al. | |
| 2013/0147054 A1 | 6/2013 | Lin et al. | |
| 2013/0203215 A1 | 8/2013 | Hung et al. | |
| 2013/0260510 A1 | 10/2013 | Theuss | |
| 2015/0008586 A1 | 1/2015 | Tsai et al. | |
| 2015/0008587 A1 | 1/2015 | Lin et al. | |
| 2015/0076713 A1 | 3/2015 | Tsai et al. | |
| 2016/0049389 A1 | 2/2016 | Chen et al. | |

\* cited by examiner

INTEGRATED FAN-OUT PACKAGE STRUCTURES WITH RECESSES IN MOLDING COMPOUND

PRIORITY CLAIM AND CROSS-REFERENCE

This application is a continuation of U.S. patent application Ser. No. 16/101,902, entitled "Integrated Fan-Out Package Structure with Recesses in Molding Compound," filed Aug. 13, 2018, which is a continuation of U.S. patent application Ser. No. 15/297,670, entitled "Integrated Fan-Out Package Structure with Recesses in Molding Compound," filed Oct. 19, 2016, now U.S. Pat. No. 9,953,955 issued Apr. 24, 2018, which is a continuation of U.S. patent application Ser. No. 14/858,530, entitled "Integrated Fan-Out Package Structure with Recesses in Molding Compound," filed Sep. 18, 2015, now U.S. Pat. No. 10,062,662 issued Aug. 28, 2018, which application is a divisional of U.S. patent application Ser. No. 14/026,742, entitled "Integrated Fan-Out Package Structures with Recesses in Molding Compound," filed on Sep. 13, 2013, now U.S. Pat. No. 9,142,432 issued Sep. 22, 2015 which applications are incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly with time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 12A are cross-sectional views of intermediate stages in the manufacturing of an Integrated Fan-Out (InFO) package in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An Integrated Fan-Out (InFO) package including fan-out redistribution lines and the methods of forming the same are provided in accordance with various exemplary embodiments. The intermediate stages of forming the InFO package are illustrated. The variations of the embodiments are discussed. Throughout the various views and illustrative embodiments, like reference numbers are used to designate like elements.

Figure 1:
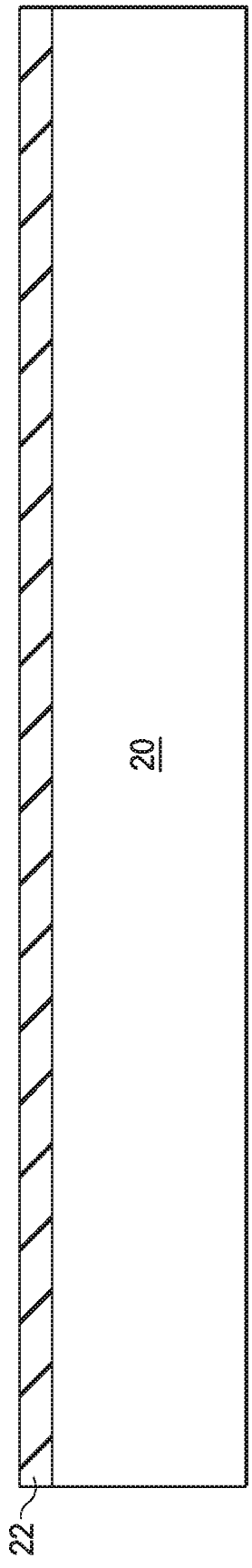

FIGS. 1 through 12A are cross-sectional views of intermediate stages in the manufacturing of a package structure in accordance with some exemplary embodiments. Referring to FIG. 1, carrier 20 is provided, and polymer base layer 22 is laminated on carrier 20. Carrier 20 may be a blank glass carrier, a blank ceramic carrier, or the like. Polymer base layer 22 may be formed of Ajinomoto Buildup Film (ABF), polyimide, PolyBenzOxazole (PBO), BenzoCycloButene (BCB), Solder Resist (SR) film, Die-Attach Film (DAF), or the like, although other types of polymers may be used. Polymer base layer 22 has a planar top surface.

Figure 2:
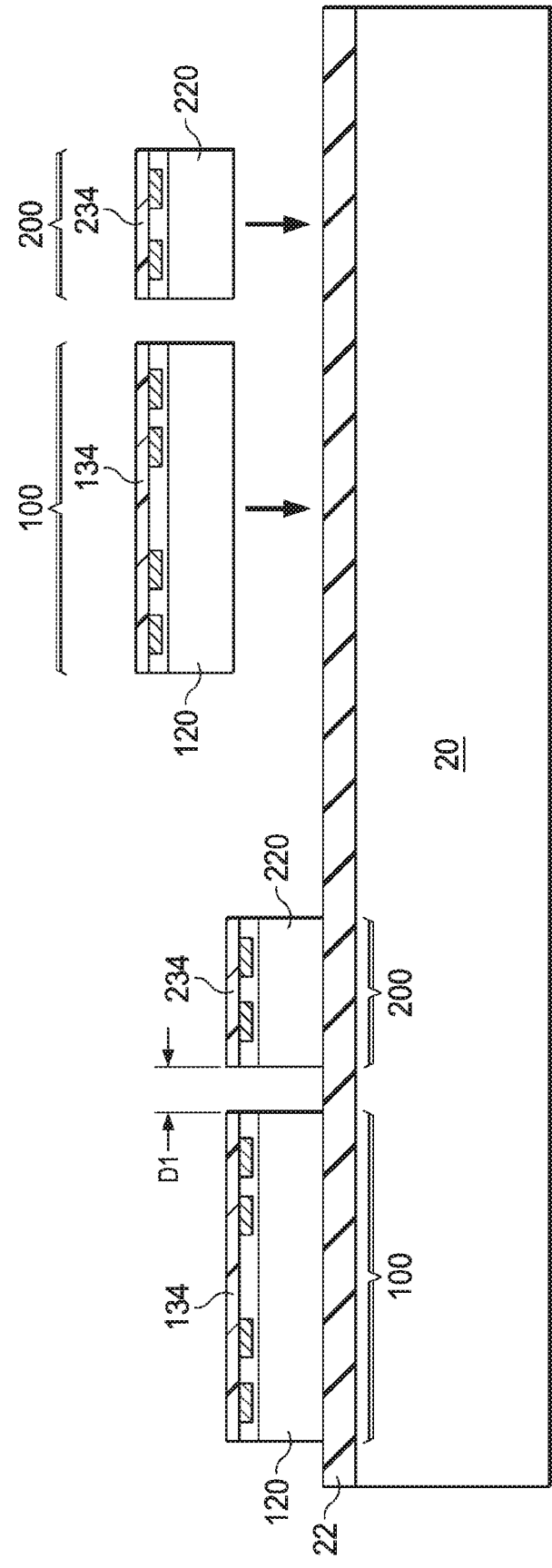

FIG. 2 illustrates the placement of device dies 100 and 200 over polymer base layer 22. In some embodiments, an additional adhesive layer (not shown) is disposed underlying each of device dies 100 and 200 to adhere the respective device dies 100 and 200 to polymer base layer 22. In alternative embodiments, no additional adhesive layer is disposed, and device dies 100 and 200 are in contact polymer base layer 22. Device dies 100 and 200 may be logic device dies including logic transistors therein. In some exemplary embodiments, device dies 100 and 200 are designed for mobile applications, and may include Central Computing Unit (CPU) dies, Power Management Integrated Circuit (PMIC) dies, Transceiver (TRX) dies, or the like. Device dies 100 and 200 may have structures that are different from each other, or may have structures identical to each other. Each of device dies 100 and 200 includes a semiconductor substrate 120/220 (refer to FIG. 12A) that contacts the adhesive layer, wherein the back surface of the semiconductor substrate 120/220 is in contact with the adhesive layer. Semiconductor substrate 120 and 220 may be silicon substrates in some embodiments. In some embodiments, each device dies 100 and one of the neighboring device dies 200 are located close each other, for example, with distance D1 being smaller than about 150 µm. Distance D1 may also be greater than about 25 µm.

Figure 3:
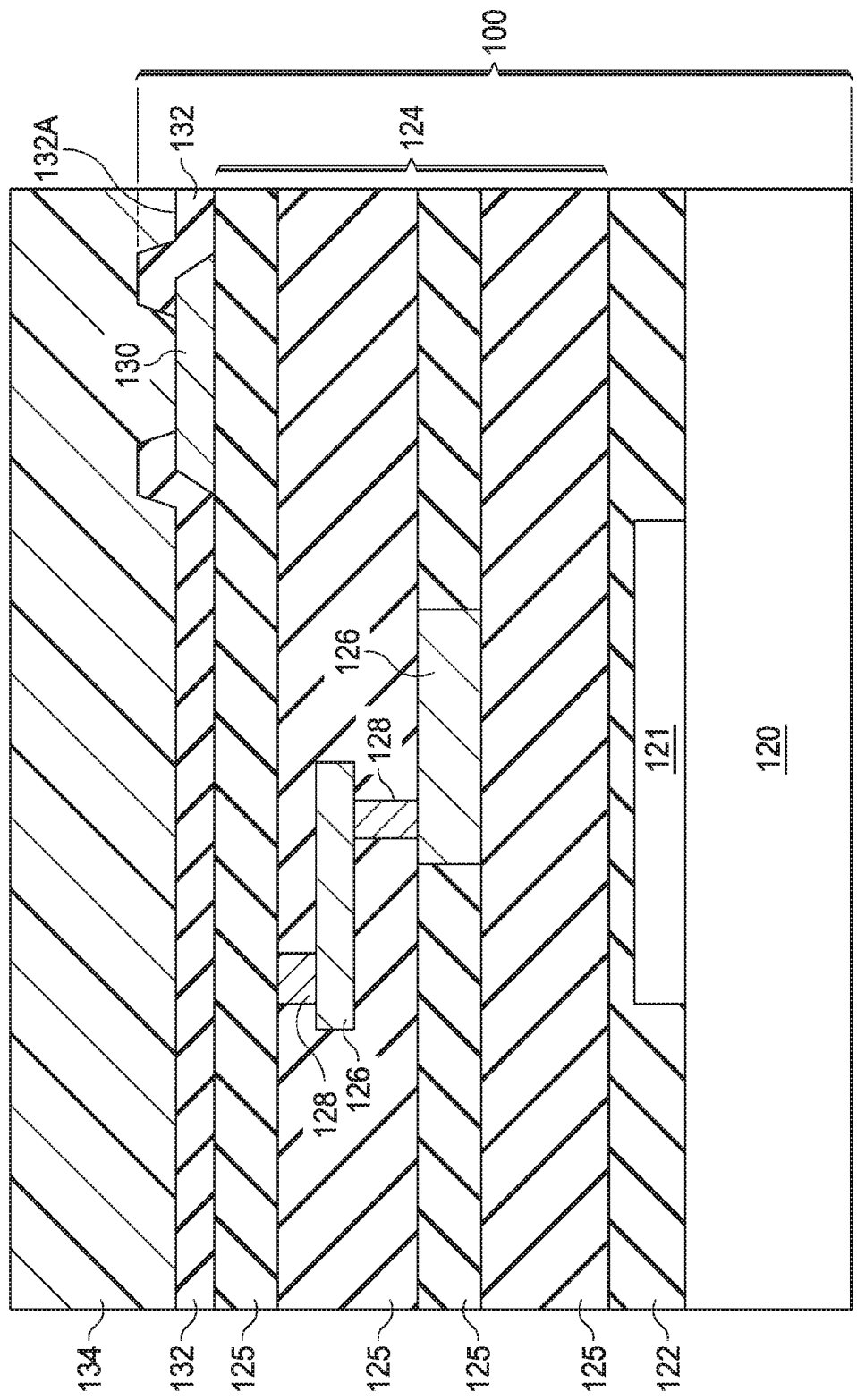

Device dies 100 and 200 are schematically illustrated in FIG. 2. FIG. 3 illustrates a cross-sectional view of device die 100, wherein more details are illustrated. As shown in FIG. 3, device die 100 includes semiconductor substrate 120. Semiconductor substrate 120 may be a bulk silicon substrate or a silicon-on-insulator substrate, while other semiconductor materials including group III, group IV, and group V elements may also be used. Integrated circuit devices such as transistors (schematically illustrated as 121) are formed at a surface of semiconductor substrate 120.

Device die 100 may further include Inter-Layer Dielectric (ILD) 122 over semiconductor substrate 120, and metal layers 124 over ILD 122. Metal lines 126 and vias 128 are formed in dielectric layers 125. The combination of metal lines at a same level is referred to a metal layer hereinafter. Accordingly, a plurality of metal layers 124 are interconnected through vias 128. In some embodiments, dielectric layers 125 are formed of low-k dielectric materials. The dielectric constants (k values) of the low-k dielectric materials may be less than about 3.0, or less than about 2.5, for example. Metal lines 126 and vias 128 may be formed of copper or copper alloys, although they can also be formed of other metals.

Figure 7:
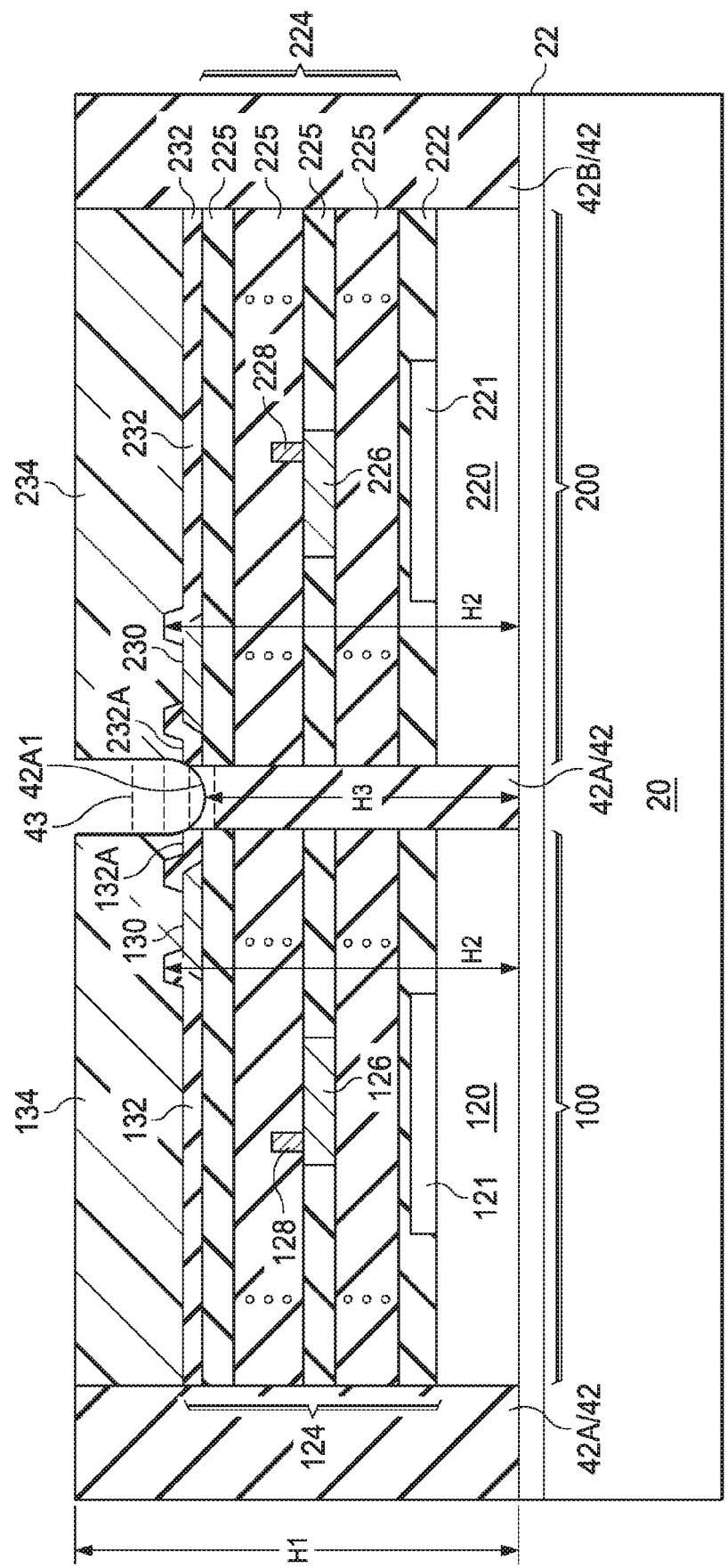
Figure 12A:
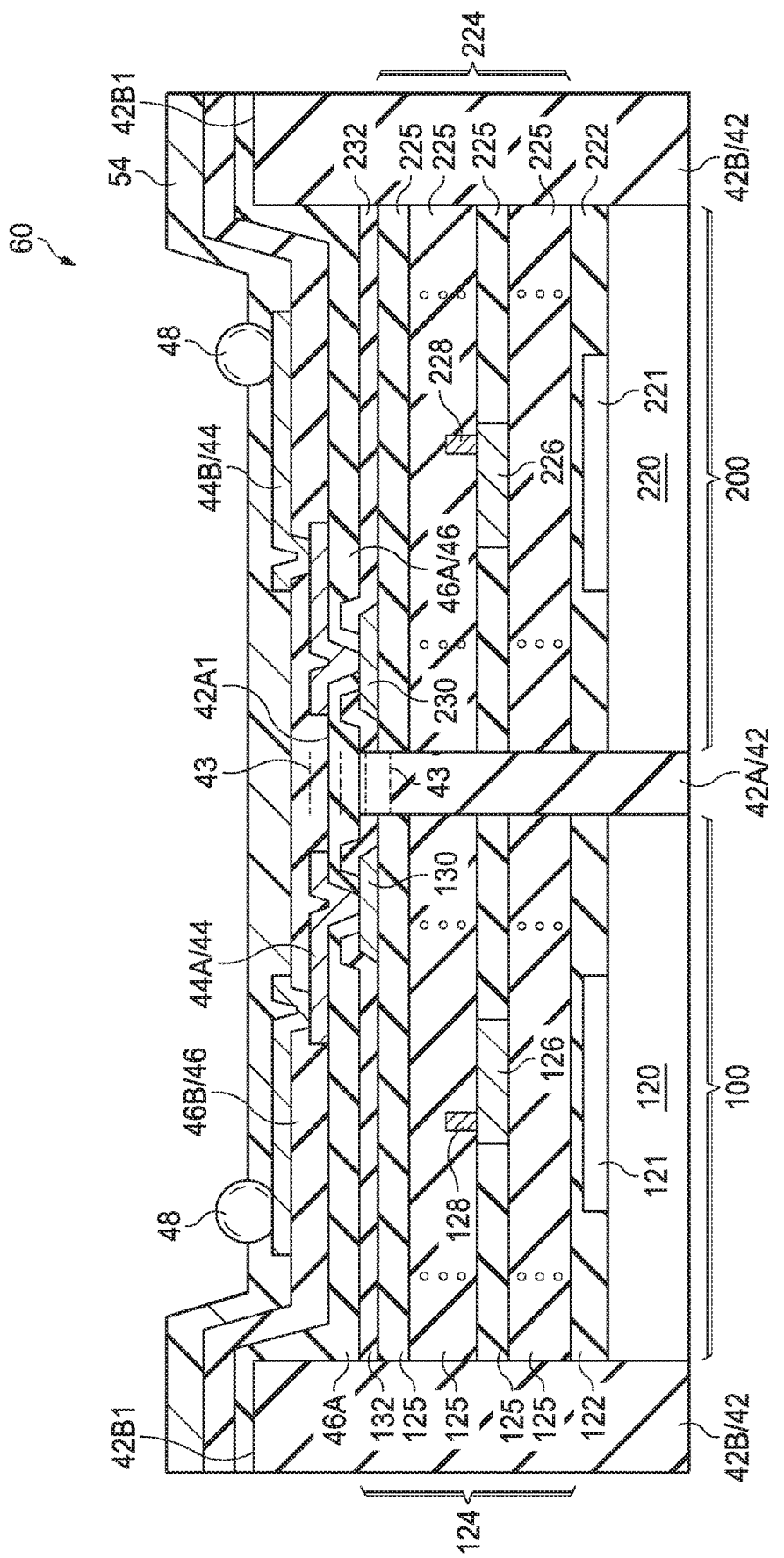

Device dies 200 (FIG. 2) may have a structure similar to that of device die 100, although the structures of device dies 100 and 200 may also be different from each other. Therefore, the materials and the structures of the features in device dies 200 may be found referring to the like features in device die 100 as described referring to FIG. 3. The like features in device dies 200 are marked with reference numerals starting with number "2," which features correspond to the features in device dies 100 and having reference numerals starting with number "1." Some of the features in device die 200 are schematically illustrated in FIGS. 7 and 12A.

Referring again to FIG. 3, metal pad 130 is formed over metal layers 124, and may be electrically coupled to metal lines 126 and vias 128. Metal pad 130 may be an aluminum pad or an aluminum-copper pad, and hence is alternatively referred to as aluminum pad 130 hereinafter, although other metallic materials may be used. Passivation layer 132 is formed over metal layers 124. Portions of passivation layer 132 may cover the edge portions of aluminum pad 130. The central portion of aluminum pad 130 is exposed through the opening in passivation layer 132. Passivation layer 132 may be a single layer or a composite layer, and may be formed of a non-porous material. In some embodiments, passivation layer 132 is a composite layer comprising a silicon oxide layer (not shown), and a silicon nitride layer (not shown) over the silicon oxide layer. Alternatively, passivation layer 132 is formed of Un-doped Silicate Glass (USG), silicon oxynitride, and/or the like. Throughout the description, top surface 132A of passivation layer 132 is referred to as the top surface of device die 100 hereinafter.

Over passivation layer 132 and metal pad 130 resides protection film 134. In some embodiments, protection film 134 comprises a Backside Grinding (BG) tape, a laminating tape including a polyimide and an adhesive, an Ultra-Violet (UV) tape, or the like. Protection film 134 may be the same film that is used in the manufacturing of device die 100. For example, in the formation of device die 100, after the formation of passivation layer 132, a backside grinding tape is adhered to passivation layer 132, so that the backside of substrate 120 is grinded in order to thin die 100 and the respective wafer. After the grinding, the respective wafer is sawed together with the backside grinding tape to separate die 100 from other dies. A piece of backside grinding tape is left adhered to passivation layer 132, and becomes protection film 134.

Figure 4:
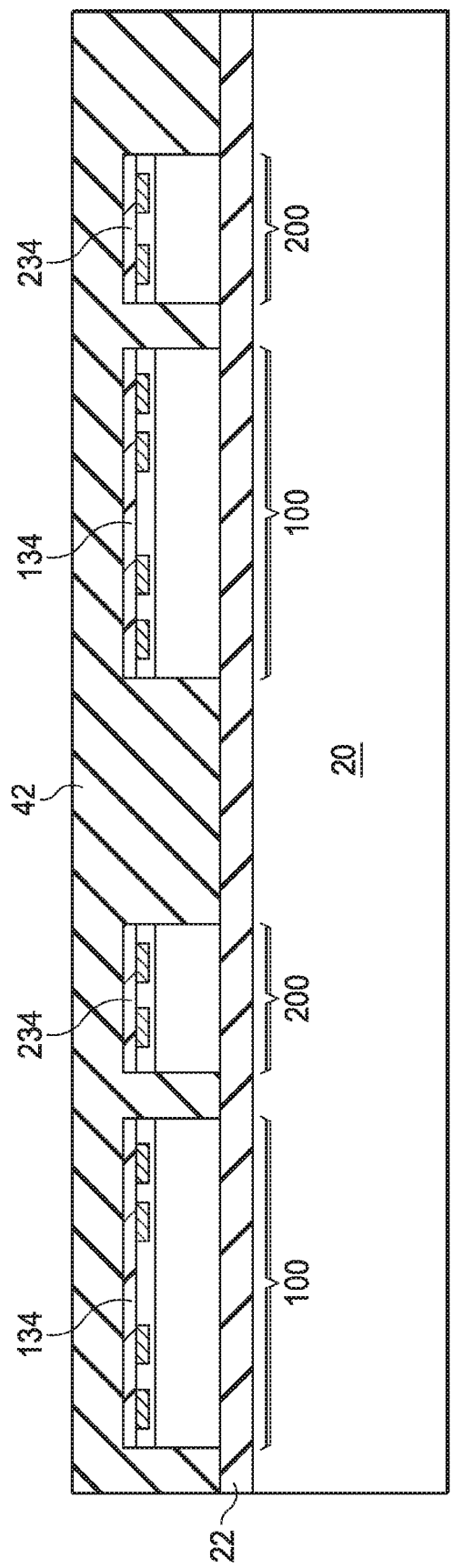

Referring to FIG. 4, molding material 42 is molded on device dies 100 and 200. Molding material 42 fills the gaps between device dies 100 and 200, and may be in contact with polymer base layer 22. Molding material 42 may include a molding compound, a molding underfill, an epoxy, or a resin. The top surface of molding material 42 is higher than the top surfaces of protection films 134 and 234, which cover device dies 100 and 200, respectively.

Figure 5:
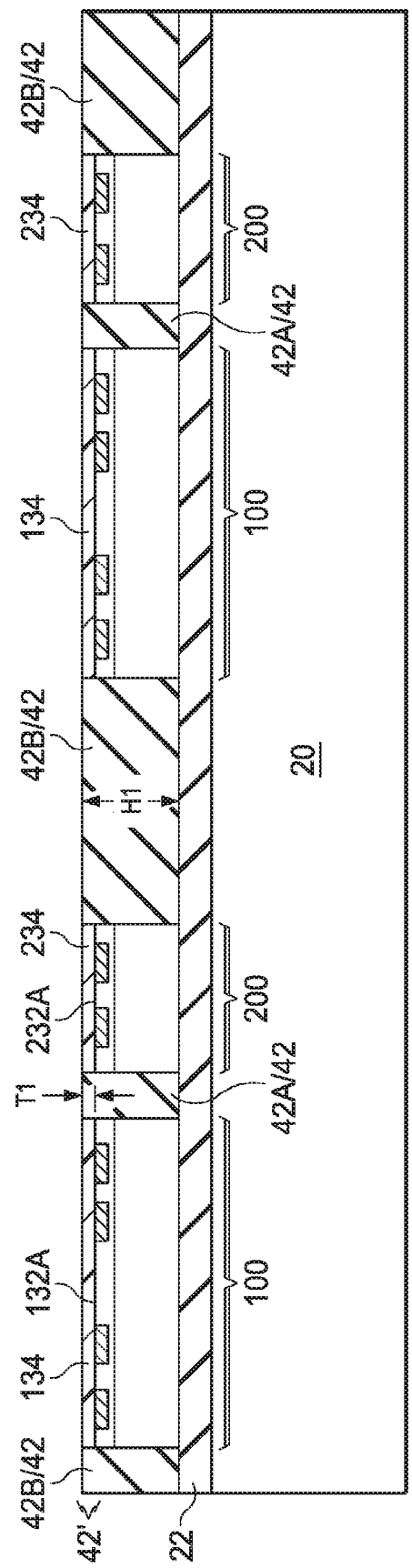

Next, a grinding step is performed to remove excess portions of molding material 42, until protection films 134 and 234 are exposed. The resulting structure is shown in FIG. 5. Molding material 42 includes a portion 42A between device die 100 and 200, and portions 42B surrounding portion 42A and device dies 100 and 200 (also refer to FIG. 12B). Molding material portion 42A has a top surface substantially level with the top surfaces of protection films 134 and 234. Accordingly, molding material portion 42A includes a top portion 42' above the top surface 132A of device die 100 and/or top surface 232A of device die 200. Thickness T1 of the top portion 42' of molding material portion 42A may be in the range between about 3 μm and about 40 μm, for example. After the grinding, molding material 42 has height H1, which may be greater than about 80 μm, and may be in the range between about 80 μm and about 280 μm.

Figure 6:
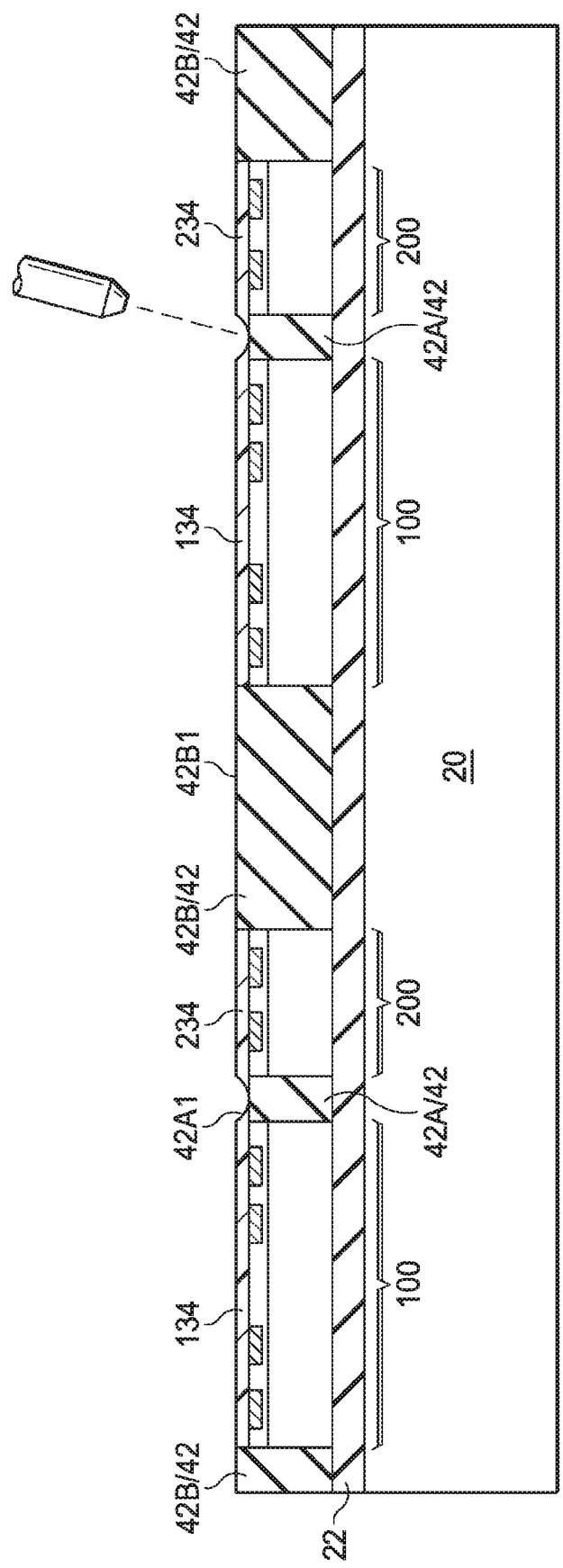

FIG. 6 illustrates the recessing of molding material portions 42A. In some embodiments, the recessing is performed through laser drill, as schematically illustrated. The surrounding portions 42B are not recessed. Accordingly, top surface 42A1 of the remaining molding material portion 42A is lower than top surface 42B1 of the surrounding portions 42B.

FIG. 7 illustrates a magnified view of device dies 100 and 200 and molding material 42. As shown in FIG. 7, after the recessing, top surface 42A1 of molding material portion 42A may be level with top surfaces 132A of device die 100 and/or top surface 232A of device die 200. In alternative embodiments, top surface 42A1 is higher than top surfaces 132A and/or 232A. In yet alternative embodiments, top surface 42A1 is lower than top surfaces 132A and/or 232A. As illustrated, top surfaces 42A1 may also be lower than the bottom surfaces of metal pads 130 and/or 230. Dashed lines 43 illustrate several possible positions of top surfaces 42A1 in various embodiments. Alternatively stated, the remaining molding material portion 42A has height H3, wherein height H3 may be greater than, equal to, or smaller than the height H2 (thicknesses) of device die 100 and height H2' of device die 200. In some embodiments, height difference (H1−H3) is between about 2 μm and about 35 μm. Height H3 may be greater than about 50 μm in some exemplary embodiments.

Figure 8:
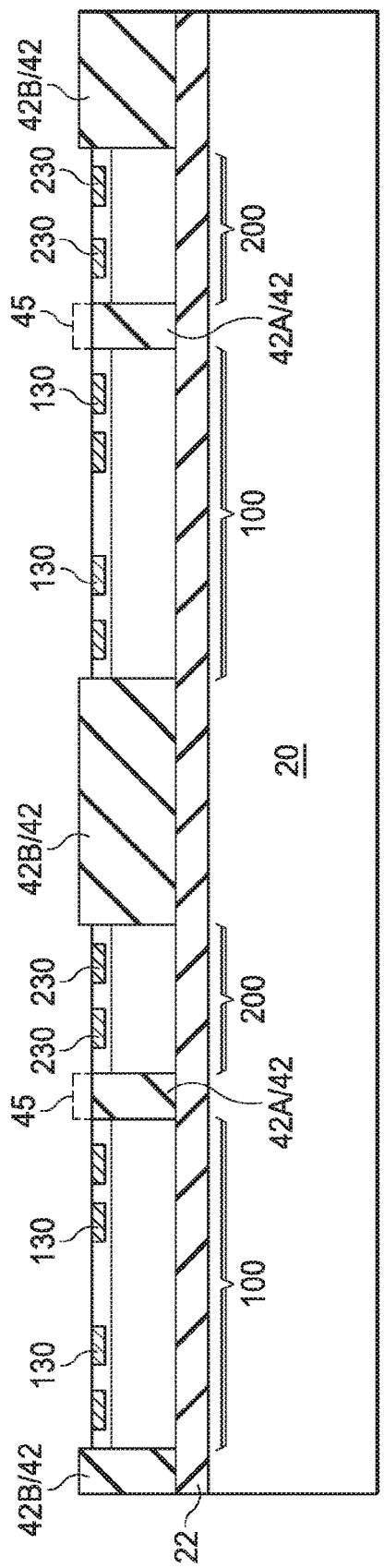

Protection films 134 and 234 are then removed, as shown in FIG. 8. Passivation layers 132 and 232 (refer to FIG. 7) and metal pads 130 and 230 are exposed. It is appreciated that if molding material portion 42A is not recessed, the protruding portions of molding material portion 42A, as illustrated by dashed lines 45, will form humps that protrude above the top surfaces of dies 100 and 200, which are on the opposite sides of molding material portion 42A. The humps may have the heights equal to the thicknesses of protection films 134 and 234. Accordingly, the heights of the humps may be in the range between about 3 μm and about 40 μm. The humps thus form long and tall walls that have the length equal to the length of device dies 100 and 200. Hence, if the humps are left un-removed, the humps will affect the subsequent photolithography processes, and may cause cracks in the resulting package.

Figure 9:
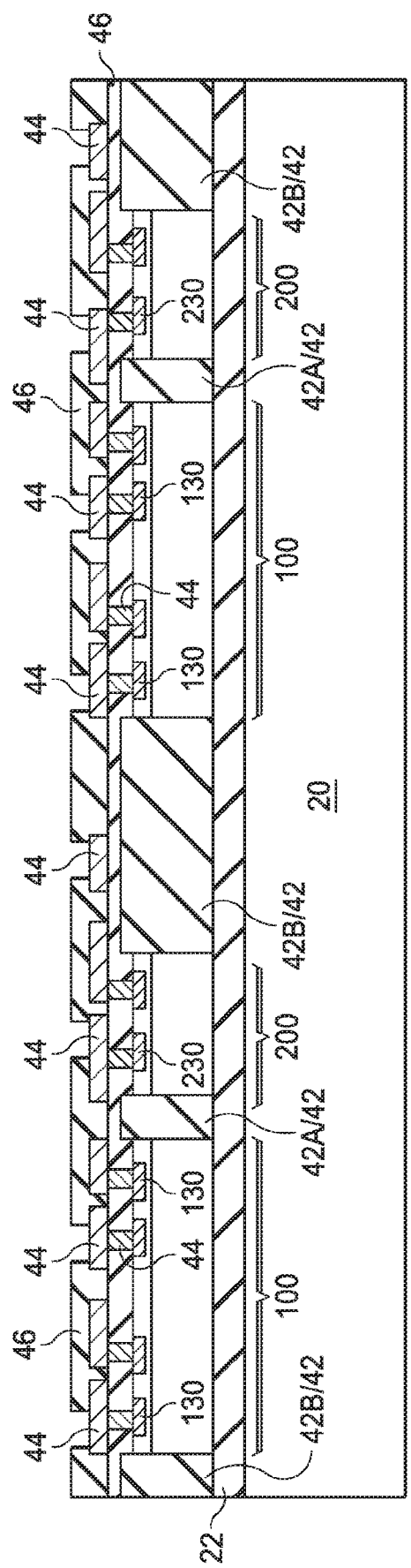

Next, referring to FIG. 9, Redistribution Lines (RDLs) 44 are formed over molding material 42 to connect to metal pads 130 and 230. RDLs 44 may also interconnect metal pads 130 and 230. In accordance with various embodiments, one or a plurality of dielectric layers 46 are formed over the structure shown in FIG. 8, with RDLs 44 formed in dielectric layers 46. FIG. 9 illustrates the schematic view of RDLs 44 and dielectric layers 46, while the details of RDLs 44 and dielectric layers 46 may be found in FIG. 12A. In some exemplary formation process, the formation of one layer of RDLs 44 and dielectric layers 46 includes forming a blanket copper seed layer, forming and patterning a mask layer over the blanket copper seed layer, performing a plating to form RDLs 44, removing the mask layer, and performing a flash etching to remove the portions of the blanket copper seed layer not covered by RDLs 44. RDLs 44 may comprise a metal or a metal alloy including aluminum, copper, tungsten, nickel, and/or alloys thereof.

FIG. 12A illustrates a more detailed view of RDLs 44 and dielectric layers 46. In FIG. 12, two layers of RDLs 44 (including 44A and 44B) are illustrated. Dielectric layers 46 (including 46A and 46B) in these embodiments may comprise polyimide, benzocyclobutene (BCB), polybenzoxazole (PBO), or the like. Alternatively, dielectric layers 46 may include non-organic dielectric materials such as silicon oxide, silicon nitride, silicon carbide, silicon oxynitride, or the like.

Figure 10:
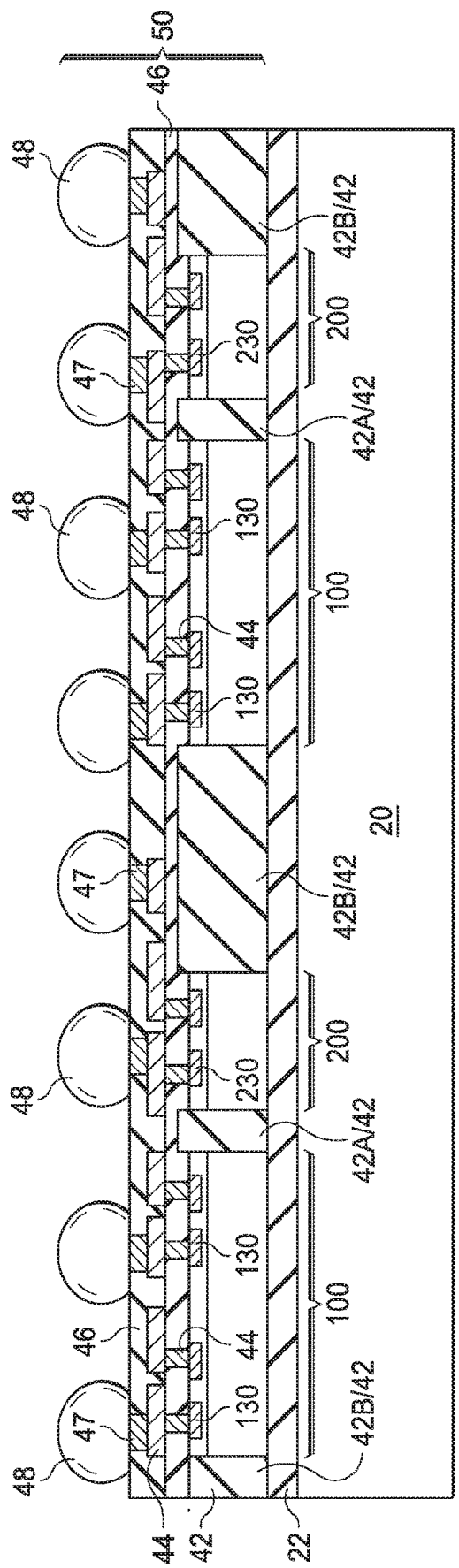

FIG. 10 illustrates the formation of electrical connectors 48 in accordance with some exemplary embodiments. The formation of electrical connectors 48 may include forming Under-Bump Metallurgies (UBMs) 47 on RDLs 44, placing solder balls on the exposed portions of UBMs 47, and then reflowing the solder balls. In alternative embodiments, the formation of electrical connectors 48 includes performing a plating step to form solder regions over RDLs 44 or UBMs 47, and then reflowing the solder regions. Electrical connectors 48 may also include metal pillars, or metal pillars and solder caps, which may also be formed through plating. In the embodiments in which electrical connectors 48 are solder balls, the lower parts of solder balls 48 may be molded in molding compound 54, while the upper parts of solder balls 48 are exposed. Throughout the description, the combined structure including device dies 100 and 200, molding material 42, and the overlying RDLs 44 and dielectric layers 46 is referred to as package 50, which may be a composite wafer.

Figure 11:
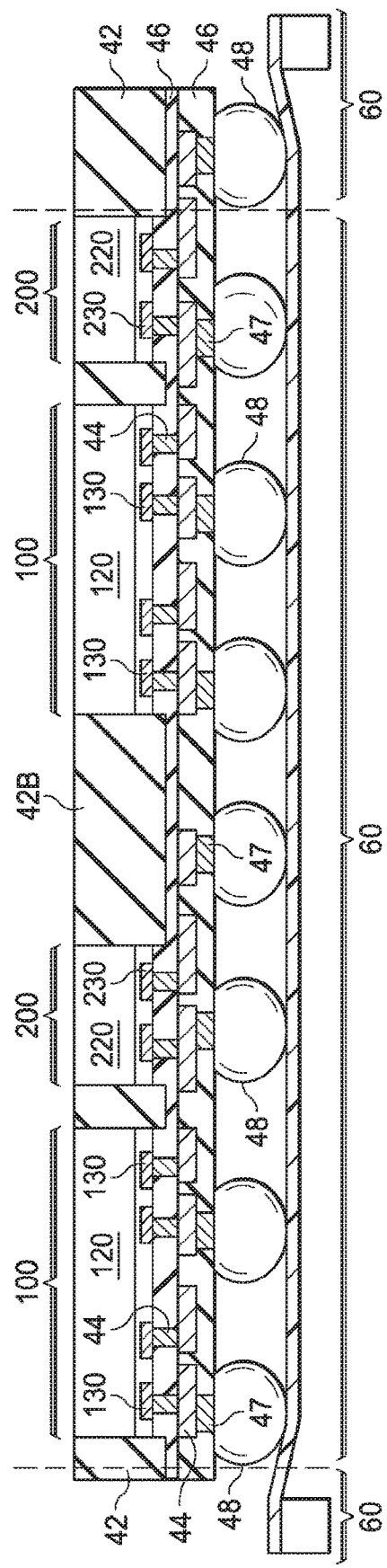

Next, package 50 is de-bonded from carrier 20. Polymer base layer 22 and adhesive layers (if any) are also removed from package 50. The resulting structure is shown in FIG. 11. In alternative embodiments, polymer base layer 22 is not removed, and is left in the resulting package. As a result of the de-bonding, molding material 42 and the back surfaces of device dies 100 and 200 are exposed. Nest, package 50 is further adhered to dicing tape 52, wherein electrical connectors 48 face toward, and may contact, dicing tape 52.

Figure 12B:
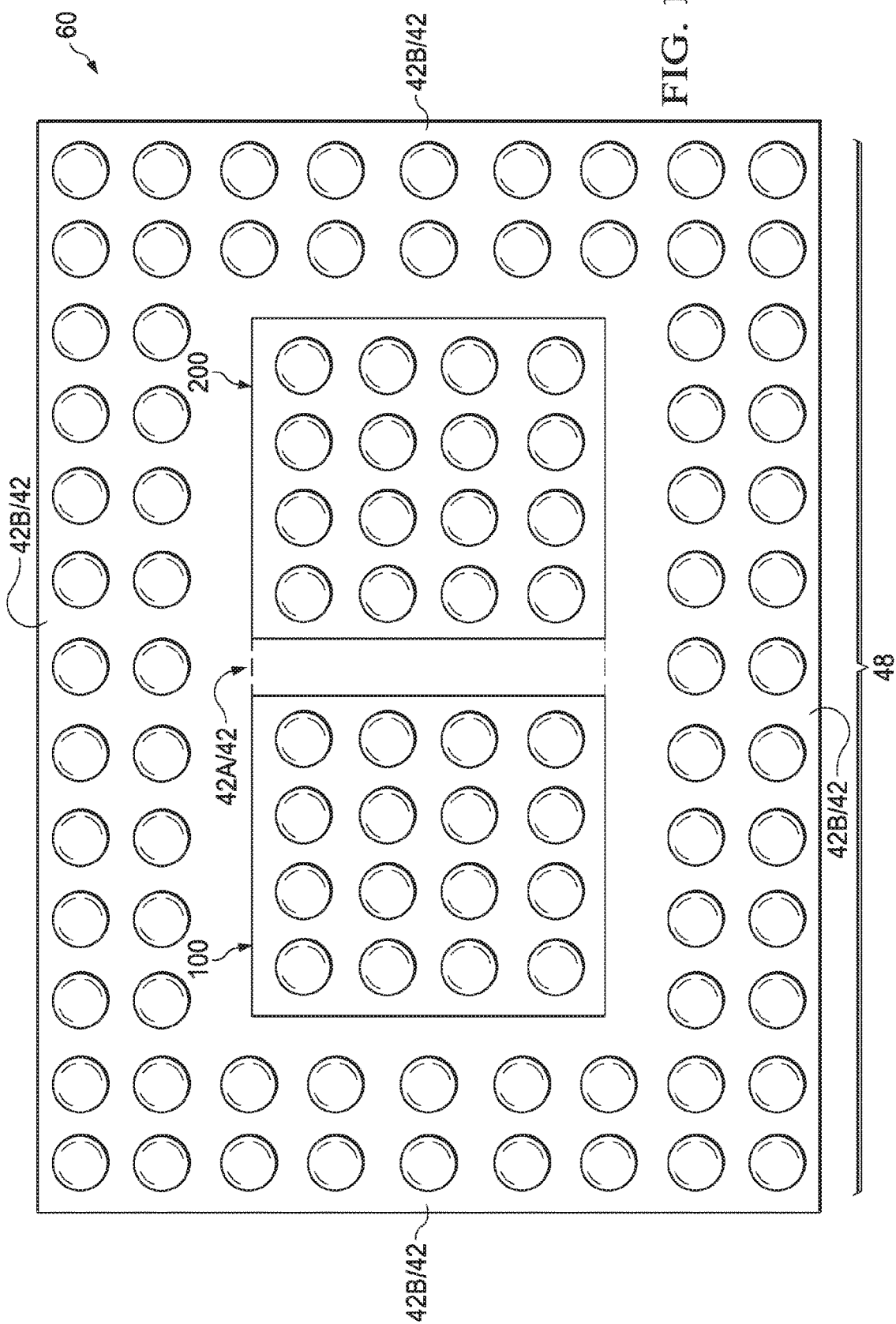
FIG. 12B illustrates a top view of an InFO package in accordance with exemplary embodiments.

Next, package 50 is sawed into a plurality of packages 60. FIGS. 12A and 12B illustrate a cross-sectional view and a top view, respectively, of one of packages 60. As shown in FIG. 12A, one or more dielectric layers 46 (including 46A and 46B), which may be polymer layers, are over passivation layers 132 and 232, and continuously extends from the region directly over device die 100 to the region directly over device die 200. Dielectric layers 46 may be polymer layers comprising polyimide, PBO, BCB, or the like. RDLs 44 may include one or more layers such as RDLs 44A and RDLs 44B, which are formed in dielectric layers 46. The top surface 42A1 of molding material portion 42A is in contact with the bottom surface of dielectric layer 46A. The top surface 42A1 of molding material portion 42A is lower than top surface 42B1 of portions 42B of molding material 42, which portions 42B form a ring surrounding both device dies 100 and 200.

As shown in FIG. 12B, portions 42A and 42B of molding material 42 are illustrated. Portion 42B forms a ring encircling portion 42A and device dies 100 and 200. Furthermore, the opposite ends of molding material portion 42A are connected to ring portion 42B to form a continuous molding material.

In the embodiments of the present disclosure, by recessing the portion of molding compound between closely located device dies in the same package, the humps of molding materials are removed. The process difficulty (such as to the subsequent lithography process) caused by the humps and the package crack caused by the humps are eliminated.

In accordance with some embodiments, a package includes a first die and a second die. The first die includes a first substrate and a first metal pad overlying the first substrate. The second die includes a second substrate and a second metal pad overlying the second substrate. A molding compound molds the first die and the second die therein. The molding compound has a first portion between the first die and the second die, and a second portion, which may form a ring encircles the first portion. The first portion and the second portion are on opposite sides of the first die. The first portion has a first top surface. The second portion has a second top surface higher than the first top surface.

In accordance with other embodiments, a package includes a first die and a second die. The first die includes a first substrate, a first metal pad over the first substrate, and a first passivation layer covering edge portions of the first metal pad, with a center portion of the first metal pad un-covered by the first passivation layer. The first passivation layer has a first top surface. The second die includes a second substrate, a second metal pad over the second substrate, and a second passivation layer covering edge portions of the second metal pad, with a center portion of the second metal pad un-covered by the second passivation layer. The second passivation layer comprises a second top surface. A molding compound molds the first die and the second die therein. The molding compound includes a first portion between the first die and the second die, wherein the first portion comprises a third top surface, and a second portion forming a ring surrounding the first portion of the molding compound, the first die, and the second die. The second portion has a second top surface higher than the first top surface.

In accordance with yet other embodiments, a method includes placing a first die and a second die over a carrier, wherein the first die includes a first substrate and a first metal pad over the first substrate, and the second die includes a second substrate and a second metal pad over the second substrate. The method further includes molding the first die and the second die in a molding compound, and grinding the molding compound. After the grinding, a first portion of the molding compound is recessed, wherein the first portion is between the first die and the second die, and wherein a second portion of the molding compound is not recessed. Redistribution lines are then formed over and electrically coupled to the first metal pad and the second metal pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
placing a first device and a second device over a carrier;
encapsulating the first device and the second device in an encapsulant;
revealing conductive features of the first device and the second device, wherein the revealing the conductive features of the first device and the second device comprises removing entireties of protection layers, wherein the protection layers are overlapping the conductive features of the first device and the second device;
forming a dielectric layer over and contacting the first device, the second device, and the encapsulant; and
forming redistribution lines extending into the dielectric layer to connect to the conductive features.

2. The method of claim 1, wherein after the removing the protection layers, first top surfaces of the first device and the second device are lower than a second top surface of a first portion of the encapsulant.

3. The method of claim 2, wherein after the removing the protection layers, the first top surfaces of the first device and the second device are level with or higher than a third top surface of a second portion of the encapsulant, wherein the first portion and the second portion are on opposing sides of the first device.

4. The method of claim 1 further comprising performing a planarization process to reveal the first device and the second device.

5. The method of claim 4 further comprising, after the planarization process, recessing a first portion of the encapsulant, so that a first top surface of the first portion of the encapsulant is lower than a second top surface of a second portion of the encapsulant.

6. The method of claim 5, wherein the dielectric layer is over and in contact with both of the first top surface and the second top surface.

7. The method of claim 5, wherein the second portion forms a ring encircling the first device, the second device, and the first portion of the encapsulant.

8. The method of claim 5, wherein the recessing is performed through laser drilling.

9. A method comprising:
molding a first die in a molding compound, wherein the first die comprises a conductive feature, and a first dielectric layer covering the conductive feature;
lowering a top surface of the molding compound so that the first dielectric layer in the first die is revealed;
revealing the conductive feature of the first die by removing a portion of the first dielectric layer covering the conductive feature;
forming a second dielectric layer over and physically contacting both of the first die and the molding compound to form substantially horizontal surfaces; and
forming a redistribution line extending into the second dielectric layer to contact the conductive feature.

10. The method of claim 9 further comprising:
placing the first die over a carrier; and
after the redistribution line is formed, de-mounting a structure comprising the first die and the molding compound from the carrier.

11. The method of claim 9 further comprising:
forming an electrical connector over and electrically coupling to the redistribution line.

12. The method of claim 9, wherein the lowering the top surface of the molding compound and the removing the portion of the first dielectric layer are performed using different methods.

13. The method of claim 9, wherein the lowering the top surface of the molding compound comprises performing a planarization process to remove a portion of the molding compound that is over and contacting the first die.

14. The method of claim 13, wherein the lowering the top surface of the molding compound further comprises, after the planarization process, performing a laser drill process on a first portion of the molding compound, with the first portion being on a first side of the first die, so that a first top surface of the first portion of the molding compound is lower than a second top surface of a second portion of the molding compound.

15. The method of claim 14, wherein the molding compound further molds a second die therein, and the first portion is between the first die and the second die, and the second portion is a part of the molding compound that encircles both of the first die and the second die.

16. The method of claim 15, wherein in a top view of the molding compound, the first portion of the molding compound is limited between the first die and the second die.

17. A method comprising:
placing a first die over a carrier, wherein the first die comprises a first substrate and a first metal pad over the first substrate;
placing a second die over the carrier, wherein the second die comprises a second substrate and a second metal pad over the second substrate;
encapsulating the first die and the second die in a molding compound;
grinding the molding compound to expose the first die and the second die;
after the grinding, recessing a first portion of the molding compound, wherein the first portion is between the first die and the second die, and wherein after the recessing, a portion of the molding compound is left directly underlying a recess formed by the recessing; and
forming redistribution lines over and contacting the first metal pad and the second metal pad.

18. The method of claim 17, wherein after the recessing, a first top surface of the first portion of the molding compound is lower than a second top surface of a second portion of the molding compound, wherein the second portion of the molding compound encircles the first die, the second die, and the first portion of the molding compound.

19. The method of claim 17 further comprising, after the grinding the molding compound, removing a surface dielectric layer in the first die, wherein the surface dielectric layer covers the first metal pad.

20. the method of claim 17, wherein the recessing the first portion of the molding compound is performed through laser drill.

* * * * *